(12) United States Patent
Parker et al.

(10) Patent No.: US 8,375,262 B2
(45) Date of Patent: Feb. 12, 2013

(54) FIELD PROGRAMMABLE REDUNDANT MEMORY FOR ELECTRONIC DEVICES

(75) Inventors: Allan Parker, Austin, TX (US); Gregory Charles Yancey, Austin, TX (US); Bradley E. Sundahl, Austin, TN (US); Sean Michael O'Mullan, Austin, TX (US); Arthur Benjamin Oliver, Austin, TX (US); John Anthony Darilek, Bastrop, TX (US)

(73) Assignee: Spansion LLC, Sunnyvale, CA (US)

( * ) Notice: Subject to any disclaimer, the term of this patent is extended or adjusted under 35 U.S.C. 154(b) by 197 days.

(21) Appl. No.: 12/690,590

(22) Filed: Jan. 20, 2010
(Under 37 CFR 1.47)

(65) Prior Publication Data

US 2011/0179319 A1    Jul. 21, 2011

(51) Int. Cl.
*G06F 11/00* (2006.01)
*G11C 29/00* (2006.01)
(52) U.S. Cl. .................. 714/710; 714/6.13; 714/6.32
(58) Field of Classification Search .................. None
See application file for complete search history.

(56) References Cited

U.S. PATENT DOCUMENTS

| 5,161,157 | A | * | 11/1992 | Owen et al. | 714/710 |
| 5,535,164 | A | * | 7/1996 | Adams et al. | 365/201 |
| 5,995,306 | A | * | 11/1999 | Contreras et al. | 360/31 |
| 6,226,441 | B1 | * | 5/2001 | Hartung et al. | 386/314 |
| 2002/0000837 | A1 | * | 1/2002 | Keeth et al. | 327/51 |
| 2005/0028039 | A1 | * | 2/2005 | Henderson et al. | 714/42 |
| 2006/0083085 | A1 | * | 4/2006 | Ikegami | 365/200 |
| 2009/0063896 | A1 | * | 3/2009 | Lastras-Montano et al. | 714/8 |
| 2010/0082890 | A1 | * | 4/2010 | Heo et al. | 711/103 |
| 2010/0162037 | A1 | * | 6/2010 | Maule et al. | 714/5 |
| 2010/0174955 | A1 | * | 7/2010 | Carnevale et al. | 714/718 |
| 2010/0306580 | A1 | * | 12/2010 | McKean et al. | 714/8 |
| 2011/0231730 | A1 | * | 9/2011 | Allen | 714/758 |

* cited by examiner

*Primary Examiner* — Guerrier Merant
(74) *Attorney, Agent, or Firm* — Frommer Lawrence & Haug LLP; Matthew M. Gaffney

(57) ABSTRACT

An electronic device is provided including an input/output (I/O) interface, a plurality of memory elements, a controller coupled to the I/O interface and the plurality of memory elements. In the device, the controller configured for operating the plurality of memory elements during a normal operating mode of the electronic device, where responsive to receiving a command for replacing a selected memory sector in the electronic device during the normal operating mode, the controller is configured for identifying one or more available spare memory sectors in the electronic device and modifying at least one memory map in the electronic device to replace the selected memory sector with the one of the available spare memory sectors.

16 Claims, 5 Drawing Sheets

300

400

500

FIELD PROGRAMMABLE REDUNDANT MEMORY FOR ELECTRONIC DEVICES

BACKGROUND OF THE INVENTION

1. Statement of the Technical Field

The invention is directed to the field of redundant memory in electronic devices, and more particularly, to systems and methods for programming redundant memory in electronic devices.

2. Description of the Related Art

Most electronic devices operate using one or more memory elements for storing instructions or data for the electronic device. In general, conventional memory elements are fabricated using semiconductor fabrication processes in which a finite amount of the fabricated memory elements are defective. As a result, conventional memory element designs generally include a number of spare memory areas or sectors which can be activated to replace defective memory elements during post-processing screening and prior to delivery to end-users. For example, in some types of flash memory devices, four spare sectors are provided for every 128 sectors. Accordingly, during the post-production screening, memory modules with defective memory sectors can be effectively repaired by deactivating the defective memory sector, activating one of the spare sectors, and updating the memory map in the memory module to reflect the change.

In general, conventional post-fabrication screening and repair operations are performed by operating the memory elements in a high voltage programming mode. During this mode of operation, voltages significantly higher that the voltages used during normal operations are applied to the memory elements for purposes of for activating and deactivating memory sectors and updating a memory map in the electronic device. Generally, these high voltages exceed the voltage levels available in conventional end-user electronic devices, such as portable or desktop computers. As a result, if memory sectors fail after delivery to an end-user, end-users will typically not be able to repair the memory elements. In particular, end-users typically do not have access to the specialized equipment (to provide the high voltages) needed for repairing the memory elements. Accordingly, the inconvenience and complexity of reprogramming typically results in many repairable electronic devices, such as memory modules, being prematurely discarded.

BRIEF DESCRIPTION OF THE DRAWINGS

Non-limiting and non-exhaustive embodiments of the invention are described with reference to the following drawings, in which.

DETAILED DESCRIPTION

The invention is described with reference to the attached figures, wherein like reference numbers are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

The word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is if, X employs A; X employs B; or X employs both A and B, then "X employs A or B" is satisfied under any of the foregoing instances.

Briefly stated, embodiments of the invention are related to systems and methods for field programming redundant memory in an electronic device. As described above, one of the problems with programming redundant memory sectors in an electronic device, such as a memory module, is that specialized equipment (e.g., high voltage power supplies) is typically needed. To overcome the limitations of conventional systems, the various embodiments of the invention provide a system and method for field programming redundant memory in electronic devices without the need for specialized or additional hardware. In particular, the various embodiments of the invention provide an electronic device configured to allow remapping of memory elements via the use of bypass codes or keys provided at an I/O interface of the device. The remapping can be temporary or permanent. Additionally, the electronic device can be configured to determine when remapping should be performed and whether such remapping can be performed.

Figure 1:
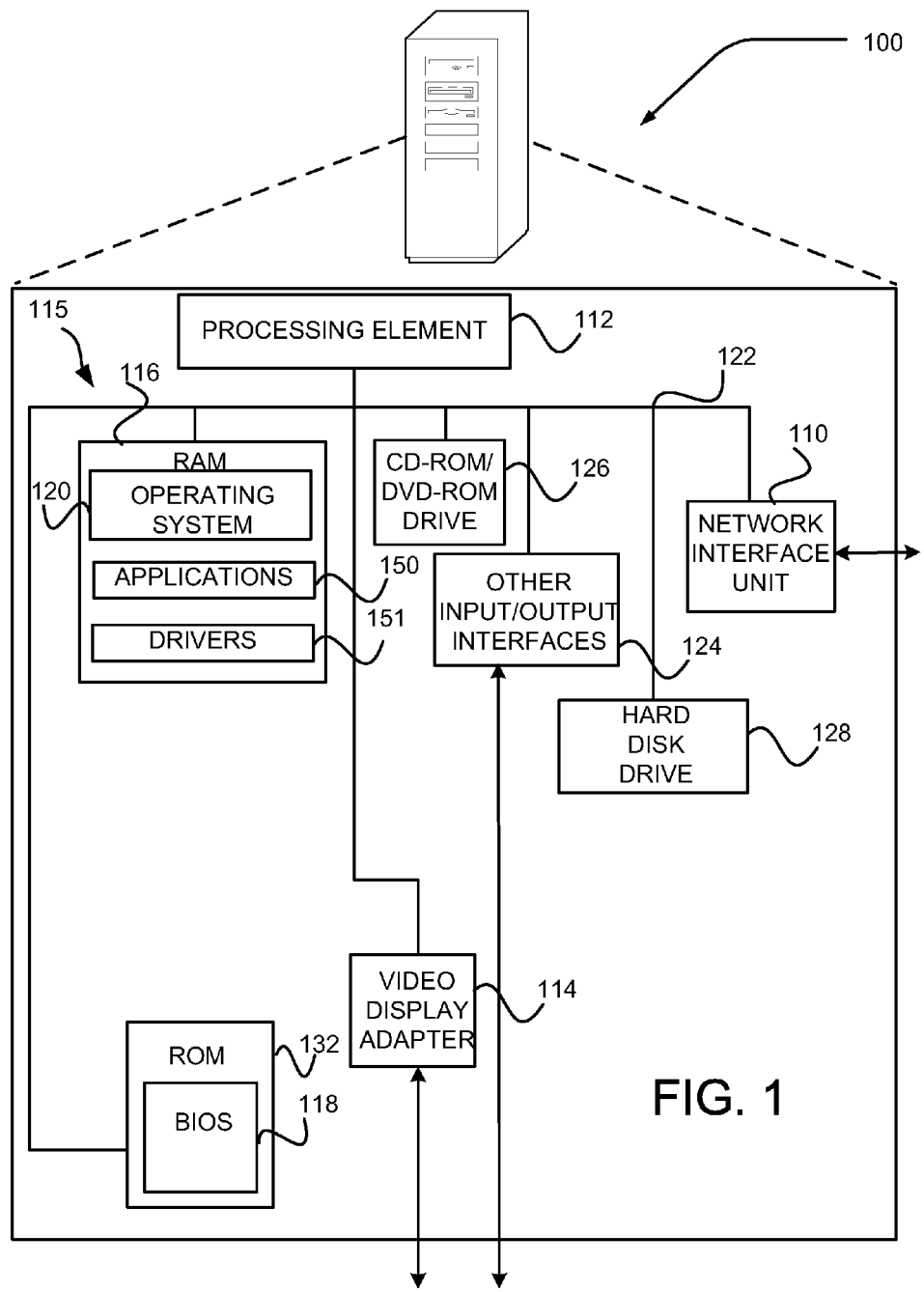
FIG. 1 is a block diagram of an exemplary computing system configured in accordance with an embodiment of the invention.

FIG. 1 is a block diagram of an exemplary computing system 100 configured in accordance with an embodiment of the invention. System 100 may include many more components than those shown. The components shown, however, are sufficient to disclose an illustrative embodiment for practicing the invention.

System 100 includes processing unit 112, video display adapter 114, and a mass memory 115, all in communication with each other via bus 122. Processing unit 112 can include one or more processing elements. Mass memory 115 generally includes system RAM 116, read-only memory (ROM) 132, and one or more permanent mass storage devices, such as hard disk drive 128, tape drive, optical drive, and/or floppy disk drive. System 100 can also include one or more other I/O interfaces 124 for supporting communications with other types of electronic devices.

In system 100, any general-purpose operating system may be employed. Basic input/output system ("BIOS") 118 is also provided for controlling the low-level operation of server 100. As illustrated in FIG. 1, system 100 also can communicate with the Internet, or some other communications network, via network interface unit 110, which is constructed for use with various communication protocols including the TCP/IP protocol. Network interface unit 110 is sometimes known as a transceiver, transceiving device, network interface card (NIC), and the like.

Mass memory 115 as described above illustrates a type of processing unit-readable storage media, which may include volatile, nonvolatile, removable, and non-removable media implemented in any method or technology for storage of information, such as processing unit readable instructions, data structures, program modules, or other data. Examples of processing unit readable storage media include DRAM, SRAM, flash or other semiconductor memory devices, CD-ROM, digital versatile disk (DVD), or other optical storage devices, magnetic cassettes, magnetic tape, magnetic disk storage or other magnetic storage devices. The various embodiments of the invention can also any other medium which can be used to store information and which can be accessed by an electronic device.

System RAM 116 also stores program code and data. An operating system 120, one or more applications 150, and drivers 151 are loaded into system RAM 116 to operate computing system 100. Examples of application programs include email programs, schedulers, calendars, web services, transcoders, database programs, word processing programs, spreadsheet programs, memory device repair programs, and so forth. Examples of drivers are video display drivers, memory device drivers, and network interface drivers.

Figure 2:
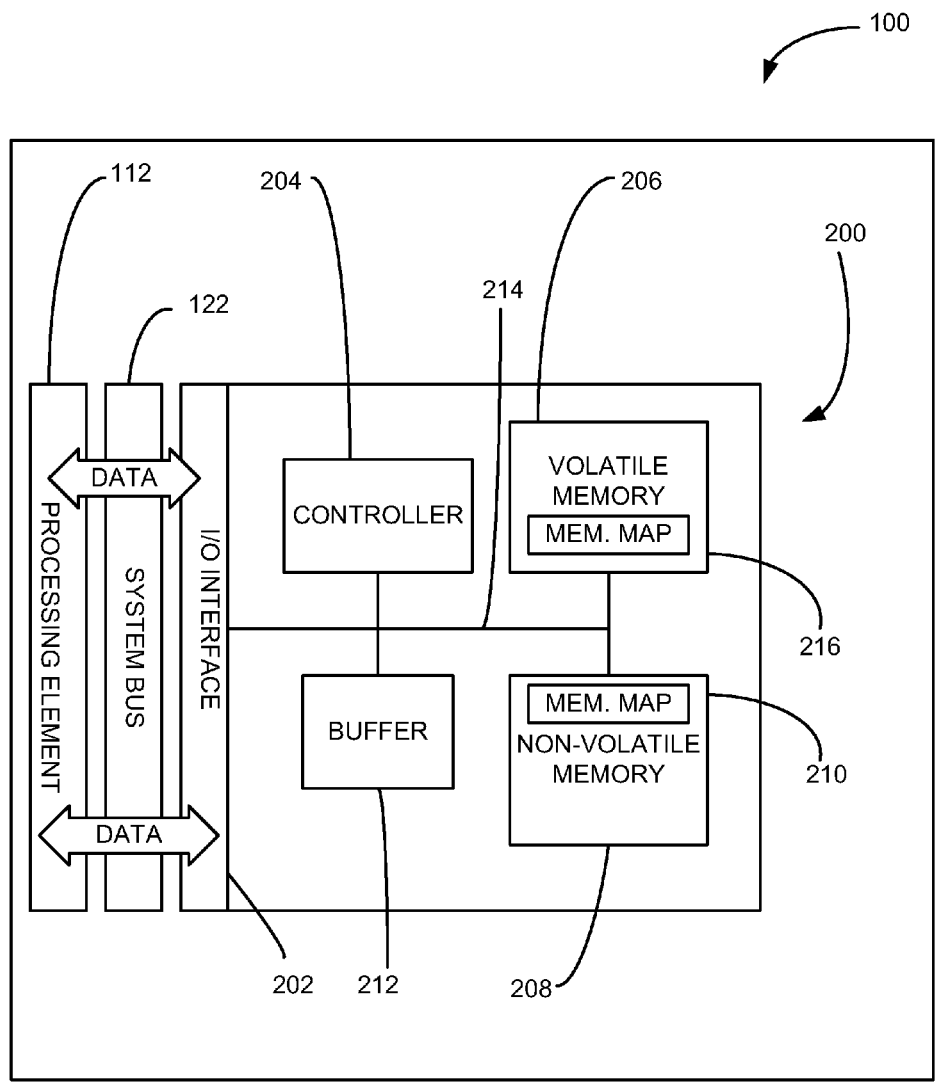
FIG. 2 is a detailed block diagram of an exemplary electronic device in the system of FIG. 1.

FIG. 2 is a detailed block diagram of an exemplary electronic device 200 in system 100 configured in accordance with an embodiment of the invention. Device 200 may include many more components than those shown. The components shown, however, are sufficient to disclose an illustrative embodiment for practicing the invention.

Although the various embodiments of the invention will be described below at times with respect to an electronic device comprising a memory module device, the invention is not limited in this regard. In the various embodiments of the invention, device 200 can be any device including one or more memory elements. For example, device 200 can be a memory module for RAM 116 or ROM 132 in FIG. 1. Device 200 can also be any of components 110, 114, 126, and 128 in FIG. 1, when configured to include one or more memory elements. Device 200 can further be any other electronic device including one or more memory elements and coupled to interface 124 in FIG. 1 or otherwise coupled to system 100.

As shown in FIG. 2, device 200 has I/O interface 202, which is coupled to system bus 122 of system 100. Via I/O interface 202, device 200 exchanges data with processing element 122 of system 100. Device 200 also includes device processing element or controller 204 for controlling operations of device 200. Device 200 further includes volatile memory 206 and non-volatile memory 208. Volatile memory 206 can be used for temporary storage of data for computing system 100. Volatile memory 206 can also be used as a working memory for controller 204 to perform memory operations on device 200. Non-volatile memory 208 can be used to provide persistent storage of data, including user data and firmware for device 200. In device 200, components 202, 204, 206, 208, and 212 can be communicatively coupled via a device bus 214.

In a normal mode of operation, device 200 can operates as follows. First, device 200 is enabled to operate in a normal operations mode. The term "normal operations mode", as used herein, refers to configuring an electronic device to perform the types of operations the electronic device was designed to perform in conjunction with an end-user computing system. A normal operation mode for device 200 can be enabled by providing by connection of device 200 to system bus 122 or by providing a power supply level(s) associated with the normal operations mode. Once device 200 is enabled, controller 204 loads the firmware stored in non-volatile memory 208 to volatile memory 206. Controller 204 also loads a default memory map into a memory map portion 216 of volatile memory 206 from a memory map portion 210 of non-volatile memory 208. The term "memory map", as used herein, refers to a table, a mapping function, or other data used by the controller 204 to associate logical addresses specified by system 100 for device 200 with physical or actual addresses in device 200. Once the firmware and memory map are loaded into volatile memory 206, controller 204 manages the exchange of data between device 200 and processing element 112. To receive data, processing element 112 transmits the data and a logical address for storing the data via system bus 122 to I/O interface 202. The data and logical address can be read by controller 202 via device bus 214, processed using the memory map in portion 216, and/or stored in a portion of volatile memory 206 or a portion of non-volatile memory 208, depending on the type of memory module.

To transmit data, controller 204 (in response to a signal from processing element 112 or other external input requesting data from a logical address) accesses the memory map in portion 216 to determine the actual location of the requested data in one of non-volatile memory 206 and non-volatile memory 208. Controller 204 then retrieves the data according to the memory map in portion 216 and stores the retrieved data in buffer memory 212. The retrieved data can then be read via I/O interface 202 by processing element 112.

As described above, in the event of a subsequent failure of a memory element in a memory module, most end-users will generally discard the memory module rather than attempt repairs. This is generally due to the low relative cost of memory modules. Additionally, even if users could affect repairs by editing the memory map in a memory module, such a configuration is not generally desired as incorrect reprogramming of devices can lead to further errors or even device inoperability. Accordingly, most electronic devices are configured to deny users direct access to its working memory. Instead, as described above, most devices have been designed to require off-line repair or outright replacement of the memory module. In some electronic devices, logic has been included for recognizing and isolating defective memory elements. In such modules, this logic is used to prevent any further data from being written to the defective memory elements. Such a configuration permits the continued use of the memory elements in the electronic device, albeit with a reduction of the amount of available memory. As a result, the overall memory capacity of the electronic device is limited.

To overcome the limitations of such conventional approaches, the various embodiments of the invention provide systems and methods for effecting memory repairs in electronic devices in the field during a normal operating mode of the device. This is illustrated below with respect to FIGS. 3-5.

Figure 3:
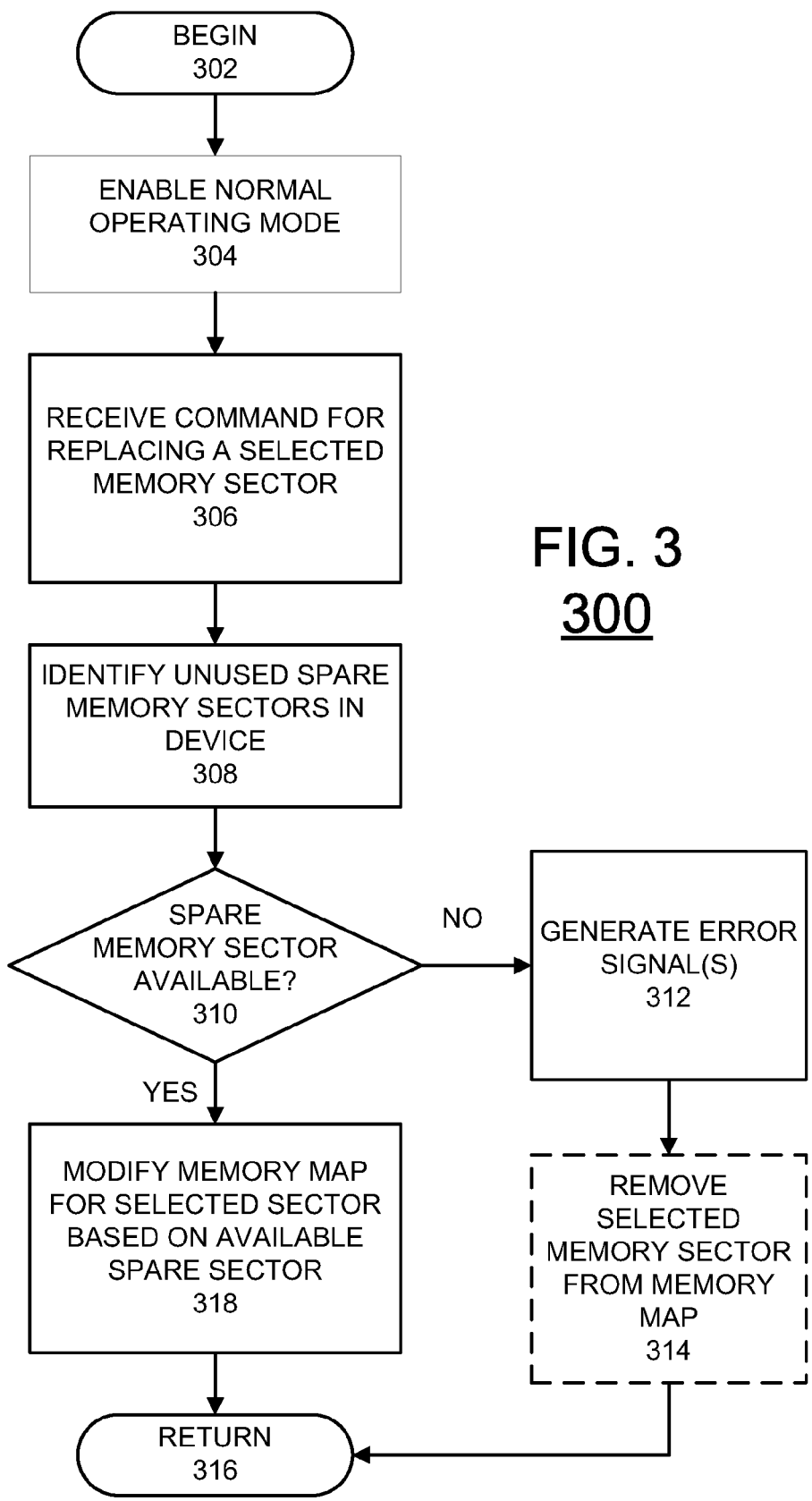
FIG. 3 is an flow diagram of steps in an exemplary method for effecting repairs in an electronic device in accordance with an embodiment of the invention.

FIG. 3 is a flow diagram of steps in an exemplary method 300 for effecting repairs in an electronic device in accordance with an embodiment of the invention. Method 300 begins at block 302 and continues to block 304. At block 304, a normal operating mode of the electronic device is enabled. As described above, this can be accomplished via powering up of the electronic device and/or connecting the electronic device to a computing system. Once the normal operating mode is enabled at block 304, repairs for faulty or defective memory elements can be performed starting at block 306.

At block 306, a command is received for replacing a selected memory sector in the electronic device. That is, the electronic device receives a command to try and replace the selected memory sector with an available spare memory sector. The command to replace a selected memory sector can be received in response to an identification of a defective memory sector. In the various embodiments of the invention, the selected memory sector in block 306 can be identified in several ways. For example, the selected memory sector for block 306 can be identified based on corruption of data. In another example, the selected memory sector for block 306 can be identified based on direct testing of memory elements. This is described below in greater detail with respect to FIG. 4.

In the various embodiments of the invention, the commands at block 306 can be generated in a variety of ways. For example, in some embodiments of the invention, a dedicated memory reprogramming/repair application can be executed on a computing system. Such an application can be used to perform testing and identification of defective memory sectors. In such embodiments of the invention, the application can be a standalone application or incorporated into another application. The application can also include or exclude a user interface. In other embodiments of the invention, the reprogramming process can be incorporated into driver loading and device activation processes, where the reprogramming process is incorporated into the software for a device driver associated with the electronic device. However, the various embodiments of the invention are not limited to these exemplary embodiments.

As described above, one concern with field repair of memory devices is the incorrect reprogramming or alteration of the memory. Accordingly, in the various embodiments of the invention, the reprogramming/repair software can be configured to generate a bypass code or key. Consequently, the controller in the electronic device will only begin the repair process if a valid bypass code is provided. For example, a computer program running on system 100 can generate a command including a bypass code for device 200 upon detection or identification of defective memory elements in device 200. Device 200 will then only begin processing the command if the bypass code matches a bypass code associated with device 200. Such a configuration allows any type of computing system, including legacy systems, to generate bypass codes without requiring additional hardware. Additionally, the use of a bypass code permits a user to restrict access to repair of memory elements to only qualified users or authorized computer programs. In the various embodiments of the invention, a bypass code can be the same or different for various electronic devices.

Once a command to replace a memory sector is received at block 306, method 300 can proceed to block 308. At block 308, a controller in the electronic device can analyze the memory elements to identify any available spare memory sectors. This identification can be made in several ways. For example, in one embodiment of the invention, a controller in the electronic device can analyze the memory map and determine whether the logical mapping includes any of the spare memory sectors in the electronic device. However, the invention is not limited in this regard and any other methods for determining active and inactive memory sectors in an electronic device can be used in the various embodiments of the invention. Once the identification is performed at block 308, method 300 can proceed to block 310.

As described above, electronic devices typically undergone screening and repair processes to replace defective memory sectors immediately after manufacturing. Furthermore, method 300 may have already been performed several times. Accordingly, it is possible that no spare memory sectors may be identified at block 308 if previous repair operations have already used all of the spare memory sectors. Accordingly, at block 310, method 300 can first determine whether a spare memory sector is available for implementing the command at block 306. If no spare memory sectors are available, method 300 proceeds to block 312. At block 312, one or more error signals can be generated and these signals can be used to notify the user that further repairs of the memory in the electronic device are not possible. These signals can be forwarded, for example, from device 200 to processing element 112 to generate indicia for the user of the failure to affect a repair. In some embodiments, method 300 can proceed to block 314, where the electronic device is configured to remove the selected memory sector from the memory map to prevent its future use. Afterwards, method 300 can proceed to block 316 to resume previous processing.

In some instances, one or more spare memory sectors may still be available at block 310. Accordingly, if at block 310 at least one spare memory sector is available, method 300 can proceed to block 318. At block 318, the memory map in the electronic device can be modified. In particular, the mapping between a logical address and the selected memory sector can be modified to provide a new mapping between the logical address and one of the available spare memory sectors. Afterwards, method 300 can resume previous processing, including repetition of method 300.

Figure 4:
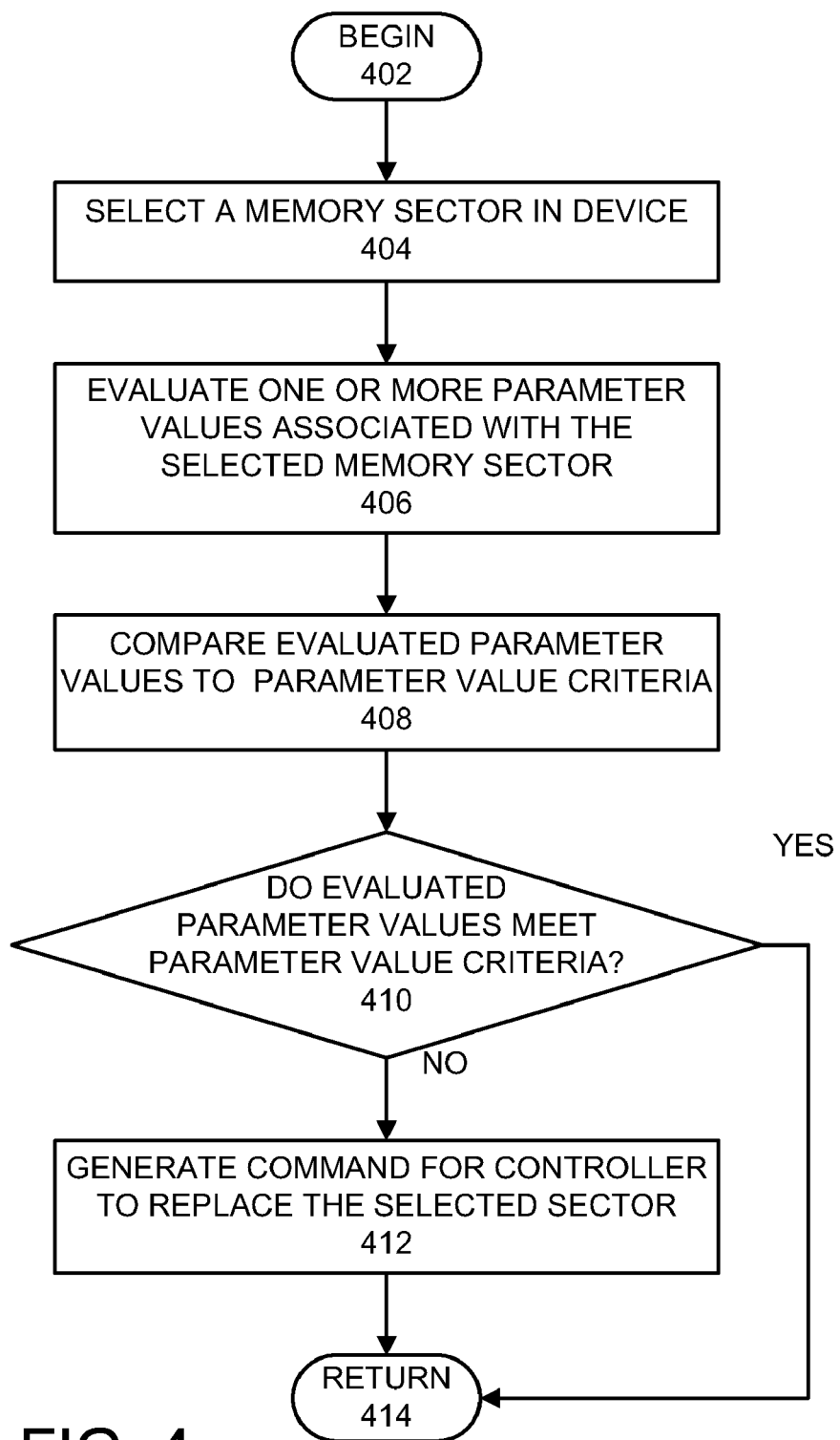
FIG. 4 is a flowchart of steps in an exemplary method 400 for generating repair commands for memory sectors in accordance with an embodiment of the invention.

As described above, the commands received at block 306 in FIG. 3 can be generated in several ways. One exemplary method is described with respect to FIG. 4. FIG. 4 is a flowchart of steps in an exemplary method 400 for generating repair commands for memory sectors in accordance with an embodiment of the invention. Method 400 begins at block 402 and proceeds to block 404. At block 404, a memory sector is selected for testing. In the various embodiments of the invention, selection of memory sectors can be performed in a variety of ways. In some embodiments, memory sectors can be selected at random or in an order fashion. In other embodiments, memory sectors can be selected in response to detecting an error or corruption of the data stored in a memory sector. In yet other embodiments, the selection of memory elements can be combined with other background processes. For example, in the case of flash memory devices, the memory sector selected for erase or copy-back operations can also be the memory sector selected for testing at block 404. Any other methods for selecting memory sectors can also be used in the various embodiments of the invention.

Once a memory sector is selected at block 404, the selected memory sector can be evaluated at block 406 to determine one or more parameter values. For example, for a flash memory module, different sectors may be evaluated to determine parameter values associated with the various characteristics of a sector and the memory cells therein, such as leakage currents, data retention times, endurance, and program times, to name a few. However, the various embodiments of the invention are not limited to obtaining solely these parameter values. Rather, the various embodiments of the invention, any type of memory device parameter values can be obtained.

Once the parameter values for the selected sector are obtained at block 406, these parameter values can be compared to parameter value criteria at block 408. Afterwards at block 410, if the comparison at block 408 indicates that the parameter values obtained at block 406 do not meet the parameter value criteria, method 400 can proceed to block 412. Otherwise, method 400 proceeds to block 414 and resumes previous processing.

In the various embodiments of the invention, a determination at block 410 that parameter values meet parameter value criteria can be made in several ways. For example, parameter value criteria is met as long as all the parameter values fall below respective upper threshold values, above a lower threshold values, or both. Once the determination is made at block 410 that the parameter values do meet the parameter value criteria, method 400 proceeds to block 412 to generate commands for replacing the selected memory sector. Method 400 can then continue to block 414 and resume previous processing. For example, method 400 can be repeated for a different memory sector or method 300 can be performed.

As described above, the memory map in the electronic device can be changed on a permanent or temporary basis. Although a permanent solution is typically desirable in many cases, it is possible that for some applications a permanent solution is not required. For example, for processing certain types of data, such as video or audio data, single or even multiple bit errors do not significantly affect the video images or sounds perceived by a user. Accordingly, in cases where the electronic device operates using both error tolerant operations and error sensitive operations, permanent replacement of memory sectors can be limited to memory sectors displaying gross errors or memory sectors used for error sensitive operations. Alternatively, two sets of parameter value criteria can be provided for evaluating different types of memory sectors associated with different operation. However, the various embodiments of the invention are not limited in this regard and any criteria for determining whether permanent or temporary changes are needed can be used. An exemplary method for providing temporary and/or permanent changes in a memory map is described below with respect to FIG. 5.

Figure 5:
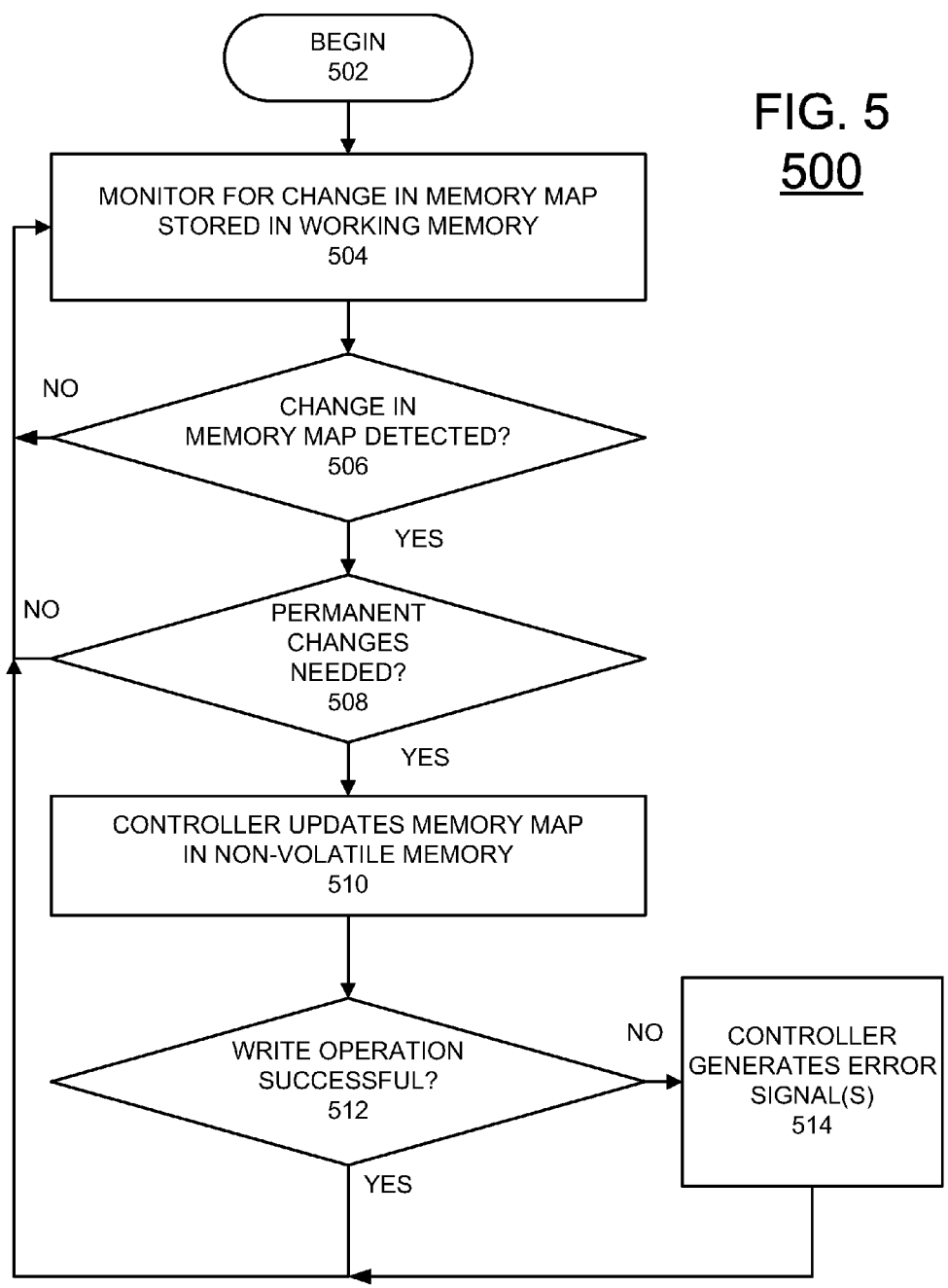
FIG. 5 is a flowchart of steps in an exemplary method 500 for updating volatile and non-volatile memory maps in an electronic device in accordance with an embodiment of the invention.

FIG. 5 is a flowchart of steps in an exemplary method 500 for updating volatile and non-volatile memory maps in an electronic device in accordance with an embodiment of the invention. Method 500 begins at block 502 and continues to block 504. At block 504, a controller in an electronic device can monitor for changes in the memory map in working (i.e., volatile) memory. These changes can occur due to, for example, performance of the method described above with respect to FIG. 3. If no change is detected at block 506, method 500 can continue to monitor for changes at block 504.

Once a change is detected at block 506, method 500 proceeds to block 508. At block 508, method 500 can determine whether the changes in the memory map in working memory need to be applied to the memory map in non-volatile memory. As described above, changes may only be required when the memory module is used exclusively for particular applications or if the memory sector displays gross errors. Therefore, the determination at block 508 can be performed in several ways. For example, a change can be required if the command for replacing a memory sector also specifies that the changes should be permanent. In such cases, different bypass codes may be associated with permanent or temporary changes. In yet another example, the electronic device can be configured to independently evaluate parameter values upon receipt of a command and determine whether changes should be temporary or permanent. For example, a controller in device 200 can be configured to perform method 400, independently of computing system 100, upon receipt of a command from a processing element of system 100.

If no permanent changes are to be made to the memory map at block 508, method 500 can return to block 504 and continue monitoring for changes in the memory map in working memory. If permanent changes are to be made to the memory map at block 508, method 500 continues to block 510. At block 510, the controller in the electronic device can access the non-volatile memory and update the memory map therein. Damage or inoperability of the device is avoided at block 510 by use of a bypass code, as described above.

If the write operation at block 510 is determined to be successful at block 512, method 500 returns to block 504 to continue monitoring for other changes in the memory map. However, if the write operation at block 510 is determined to be unsuccessful at block 512, method 500 continues to block 514. At block 514, the controller can generate one or more error signals which can be used to notify a user of the error. For example, a controller in electronic device 200 can send one or more signals, via an I/O interface, to a processing element in system 100. The processing element can then generate an appropriate output for the user. Afterwards, method 500 can return to block 504 to monitor for additional changes.

In light of the forgoing description of the invention, it should be recognized that some aspects of the invention can be realized in hardware, software, or a combination of hardware and software. A typical combination of hardware and software could be a general purpose computer processing unit, with a computer program that, when being loaded and executed, controls the computer processing unit such that it carries out the methods described herein. Of course, an application specific integrated circuit (ASIC), and/or a field programmable gate array (FPGA) could also be used to achieve a similar result.

While various embodiments of the invention have been described above, it should be understood that they have been presented by way of example only, and not limitation. Numerous changes to the disclosed embodiments can be made in accordance with the disclosure herein without departing from the spirit or scope of the invention. For example, the various portions of methods 300, 400, and 500 can be performed by a controller of device 200, a processing element in system 100, or any combination thereof. Thus, the breadth and scope of the invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others having ordinary skill in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method for operating an electronic device, comprising:
   enabling a normal operating mode of said electronic device;
   evaluating at least, one parameter value associated with a memory sector and comparing said parameter value to at least one parameter threshold value, wherein the parameter value is at least one of leakage current, data retention time, endurance, or program time;
   upon the parameter value reaching the parameter threshold value, generating a command for replacing the memory sector;
   receiving the command for replacing the memory sector in said electronic device during said normal operating mode;
   identifying one or more available spare memory sectors in said electronic device; and
   modifying at least one memory map in said electronic device to replace said memory sector with said one of said available spare memory sectors.

2. The method of claim 1, further comprising:
   if said spare memory sectors are unavailable, generating at least one error signal.

3. The method of claim 1, wherein said modifying further comprises:
   altering said memory map in a non-volatile memory portion of said electronic device.

4. The method of claim 1, wherein said modifying further comprises:
   altering said memory map in a volatile memory portion of said electronic device.

5. The method of claim 1, wherein said modifying further comprises:
   altering said memory map in a volatile memory portion of said electronic device;
   changing said memory map in a non-volatile memory portion of said electronic device based on said memory map in said volatile memory portion; and
   generating an error message if an error is detected during at least one of said altering and said changing.

6. The method of claim 1, wherein said modifying further comprises:
   confirming that said command includes a valid bypass code prior to said modifying of said memory map.

7. All electronic device, comprising:
   an input/output (I/O) interface;
   a plurality of memory elements;
   a controller coupled to said I/O interface and said plurality of memory elements, said controller configured for operating said plurality of memory elements during a normal operating mode of said electronic device,
   wherein the controller is configured to evaluate at least one parameter value associated with a memory sector and compare said parameter value to at least one parameter threshold value, wherein the parameter value is at least one of leakage current, data retention time, endurance, or program time, and upon the parameter value reaching the parameter threshold value, generating a command for replacing the memory sector;
   wherein responsive to receiving the command for replacing the memory sector in said electronic device during said normal operating mode, said controller is further configured for identifying one or more available spare memory sectors in said electronic device and modifying at least one memory map in said electronic device to replace said memory sector with said one of said available spare memory sectors.

8. The device of claim 7, wherein said controller is configured for generating at least one error signal if said spare memory sectors are unavailable.

9. The device of claim 7, wherein said controller is further configured during said modifying for altering said memory map in a non-volatile memory portion of said electronic device.

10. The device of claim 7, wherein said controller is further configured during said modifying for:
    altering said memory map in a volatile memory portion of said electronic device;
    changing said memory map in a non-volatile memory portion of said electronic device based on said memory map in said volatile memory portion; and
    generating an error message if an error is detected during at least one of said altering and said changing.

11. A computing system, comprising;
    at least one device interface;
    at least one processing element coupled to said device interface, said processing element configured for reading and writing data to said device interface, and further configured to enable evaluation at least one parameter value associated with a memory sector and comparing said parameter value to at least one parameter threshold value, wherein the parameter value is at least one of leakage current, data retention time, endurance, or program time, and upon the parameter value reaching the parameter threshold value, to enable generation a command for replacing the memory sector; and
    at least one electronic device coupled to said device interface, said electronic device configured for receiving the command for replacing the memory sector in said electronic device during a normal operating mode,
    wherein said electronic device is configured for identifying one or more available spare memory sectors in said electronic device and modifying at least one memory map in said electronic device to replace said memory sector with said one of said available spare memory sectors.

12. The system of claim 11, wherein said electronic device is further configured during said modifying for altering said memory map in a non-volatile memory portion of said electronic device.

13. The system of claim 11, wherein said electronic device is further configured during said modifying for:
    altering said memory map in a volatile memory portion of said electronic device;

changing said memory map in a non-volatile memory portion of said electronic device based on said memory map in said volatile memory portion; and generating an error message if an error is detected during at least one of said altering and said changing.

14. The system of claim 11, wherein said electronic device is further configured for determining if said command includes a valid bypass code prior to said determining.

15. The system of claim 11, wherein said processing element further comprises a software moans for writing said command to said memory interface.

16. A method, comprising:

enabling a normal operating mode of an electronic device that includes a NAND flash memory device, wherein the NAND flash memory device includes a plurality of memory sectors and a plurality of spare memory sectors;

for each memory sector of the plurality of memory sectors, evaluating at least one parameter value associated with the memory sector and comparing the parameter value to at least one parameter threshold value, wherein the parameter value is at least one of leakage current, data retention time, endurance, or program time;

for each memory sector of the plurality of memory sectors, upon the parameter value reaching the parameter threshold value:

generating a command for replacing the memory sector for which the parameter value reached the parameter threshold value;

receiving the command for replacing the memory sector during said normal operating mode;

identifying one or more available spare memory sectors of the plurality of spare memory sectors; and modifying at least one memory map in the electronic device to repine the memory sector with said one of said available spare memory sectors, wherein the modification of the memory map is performed such that the quantity of available user memory space is maintained in spite of the memory sector replacement, and such that the modification is performed during the normal operating mode of the electronic device.

* * * * *

UNITED STATES PATENT AND TRADEMARK OFFICE
CERTIFICATE OF CORRECTION

PATENT NO. : 8,375,262 B2
APPLICATION NO. : 12/690590
DATED : February 12, 2013
INVENTOR(S) : Parker et al.

It is certified that error appears in the above-identified patent and that said Letters Patent is hereby corrected as shown below:

Title Page, item (75), line 3, Inventors:
"Bradley E. Sundahl, Austin, TN (US)" should read --Bradley E. Sundahl, Austin, TX (US)--.

In the Claims:
Claim 7, column 9, line 65, "All" should read --An--;
Claim 11, column 10, line 48, "generation a" should read --generation of a--;
Claim 15, column 11, line 10, "moans" should read --means--; and
Claim 16, column 12, line 12, "repine" should read --replace--.

Signed and Sealed this
Ninth Day of July, 2013

Teresa Stanek Rea
*Acting Director of the United States Patent and Trademark Office*